US009360774B2

(12) United States Patent
Spruit et al.

(10) Patent No.: US 9,360,774 B2
(45) Date of Patent: Jun. 7, 2016

(54) LITHOGRAPHIC APPARATUS WITH A DEFORMATION SENSOR

(71) Applicant: ASML Netherlands B.V., Veldhoven (NL)

(72) Inventors: Johannes Hendrikus Maria Spruit, Waalre (NL); Ruud Antonius Catharina Maria Beerens, Roggel (NL); Richard Henricus Adrianus Van Lieshout, Batenburg (NL); Cristian Dan, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 332 days.

(21) Appl. No.: 13/720,369

(22) Filed: Dec. 19, 2012

(65) Prior Publication Data

US 2013/0162963 A1  Jun. 27, 2013

Related U.S. Application Data

(60) Provisional application No. 61/578,584, filed on Dec. 21, 2011.

(51) Int. Cl.
G03B 27/68 (2006.01)
G03B 27/54 (2006.01)
G03B 27/58 (2006.01)
G03B 27/62 (2006.01)
(Continued)

(52) U.S. Cl.
CPC .......... *G03F 7/70783* (2013.01); *G03F 7/7085* (2013.01); *G03B 27/522* (2013.01)

(58) Field of Classification Search
CPC . G03B 27/522; G03F 7/70783; G03F 7/7085; G03F 7/70716; G03F 7/70966
USPC ................ 355/30, 52, 53, 55, 67–71, 72–77; 356/32–35.5, 364–365, 927
See application file for complete search history.

(56) References Cited

U.S. PATENT DOCUMENTS

| 3,902,805 | A | * | 9/1975 | Redner | ............................ 356/33 |
| 5,298,964 | A | * | 3/1994 | Nelson et al. | .................... 356/33 |
| 6,330,052 | B1 | * | 12/2001 | Yonekawa et al. | ............... 355/53 |

(Continued)

FOREIGN PATENT DOCUMENTS

| JP | 05-188582 A | 7/1993 |
| JP | 06-148005 A | 5/1994 |

(Continued)

*Primary Examiner* — Christina Riddle
(74) *Attorney, Agent, or Firm* — Sterne, Kessler, Goldstein & Fox P.L.L.C.

(57) ABSTRACT

Disclosed is a lithographic apparatus comprising a member susceptible to deformation and a deformation sensor for measuring a deformation of said member. The deformation sensor comprises a first birefringence sensing element arranged to be subjected to stress in dependency of the deformation of said member and a light system configured to transmit polarized light through the first birefringence sensing element, wherein said polarized light has a first polarization state prior to being transmitted through the first birefringence sensing element. The deformation sensor further comprises a detector for detecting a second polarization state of the polarized light after being transmitted through the first birefringence sensing element and a calculation unit to determine the deformation of said member based on the first and second polarization state.

13 Claims, 5 Drawing Sheets

(51) Int. Cl.
  *G03F 7/20* (2006.01)
  *G03B 27/52* (2006.01)

(56) References Cited

U.S. PATENT DOCUMENTS

| | | |
|---|---|---|
| 6,587,188 B2 | 7/2003 | Gleine et al. |
| 6,881,963 B2 * | 4/2005 | Ito ................... 250/491.1 |
| 7,484,422 B2 | 2/2009 | Sumigawa et al. |
| 7,532,019 B2 | 5/2009 | Hayashi et al. |
| 8,482,719 B2 | 7/2013 | Van Eijk et al. |
| 2004/0008348 A1 | 1/2004 | Kishikawa et al. |
| 2004/0066503 A1 | 4/2004 | Hubner et al. |
| 2006/0146314 A1 * | 7/2006 | Wakana et al. ................ 356/33 |
| 2006/0170932 A1 * | 8/2006 | Hayashi et al. ................ 356/495 |
| 2011/0026004 A1 | 2/2011 | Van Eijk et al. |
| 2011/0149265 A1 * | 6/2011 | Butler et al. .................... 355/72 |

FOREIGN PATENT DOCUMENTS

| | | |
|---|---|---|
| JP | 2001-215112 A | 8/2001 |
| JP | 2003-139786 A | 5/2003 |
| JP | 2004037137 A | 2/2004 |
| JP | 2006-214856 A | 8/2006 |
| JP | 2006-258674 A | 9/2006 |
| JP | 2007-216482 A | 8/2007 |
| JP | 2011-35392 A | 2/2011 |
| WO | WO 2006/107278 A1 | 10/2006 |

* cited by examiner

LITHOGRAPHIC APPARATUS WITH A DEFORMATION SENSOR

BACKGROUND

1. Field of the Invention

The present invention relates to a lithographic apparatus comprising a deformation sensor to measure the deformation of a part of the lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Undesirable deformation of components of a lithographic apparatus may jeopardize the obtainable accuracy of said lithographic apparatus. For instance, deformation of a substrate holder configured to hold a substrate will influence the position of the substrate held by the substrate holder. This effect is even worse when the substrate holder is moved with increasing accelerations in order to improve the throughput, because the deformation of the substrate holder will likewise increase due to these accelerations.

One approach to minimize the deformations is to use a very stiff and consequently heavy substrate holder. However, also in view of the desire to use larger substrates and thus larger substrate holders, this becomes impractical. As a result, the concept of a rigid body substrate holder is left in recent developments, and instead it has been proposed to accept the presence of deformations, to measure them accurately, and to compensate them by using respective actuators in the substrate holder. In such a way, the occurring deformations are actively suppressed, which increases the obtainable accuracy of the lithographic apparatus without using bulky and consequently heavy structures.

However, so far it has been a challenge to measure the deformations of a part of the lithographic apparatus with sufficient accuracy. A further drawback is that supply wires, e.g., to carry power signals and/or information signals to and from said part, introduce disturbances to the part in case the part is a moving part within the lithographic apparatus.

SUMMARY

It is desirable to provide a lithographic apparatus with an improved deformation sensor that allows to measure the deformation of a part of the lithographic apparatus with sufficient accuracy. It may further be desirable to provide a lithographic apparatus with a deformation sensor configured such that disturbances due to supply wires are reduced.

According to an embodiment of the invention, there is provided a lithographic apparatus comprising:
- a member susceptible to deformation; and
- a deformation sensor for measuring a deformation of said member, wherein the deformation sensor comprises:
  - a first birefringence sensing element arranged to be subjected to stress in dependency of the deformation of said member;
  - a light system configured to transmit polarized light through the first birefringence sensing element, wherein said polarized light has a first polarization state prior to being transmitted through the first birefringence sensing element;
  - a detector for detecting a second polarization state of the polarized light after being transmitted through the first birefringence sensing element; and
  - a calculation unit to determine the deformation of said member based on the first and second polarization state.

According to another embodiment of the invention, there is provided a method to determine a deformation of a member of a lithographic apparatus, wherein said method comprises the following steps:
- arranging a first birefringence sensing element such that it is subjected to stress in dependency of the deformation of said member,
- transmitting polarized light through the first birefringence sensing element, wherein said polarized light has a first polarization state prior to being transmitted through the first birefringence sensing element,
- detecting a second polarization state of the polarized light after being transmitted through the first birefringence sensing element,
- determining the deformation of said member based on the first and second polarization state.

According to another embodiment of the invention, there is provided a lithographic apparatus comprising:
- a member susceptible to deformation; and
- a deformation sensor for measuring a deformation of said member in a measurement direction,
wherein one of the member and the deformation sensor is provided with a groove arranged to decrease a sensitivity of the deformation sensor for a deformation in a direction other than the measurement direction.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
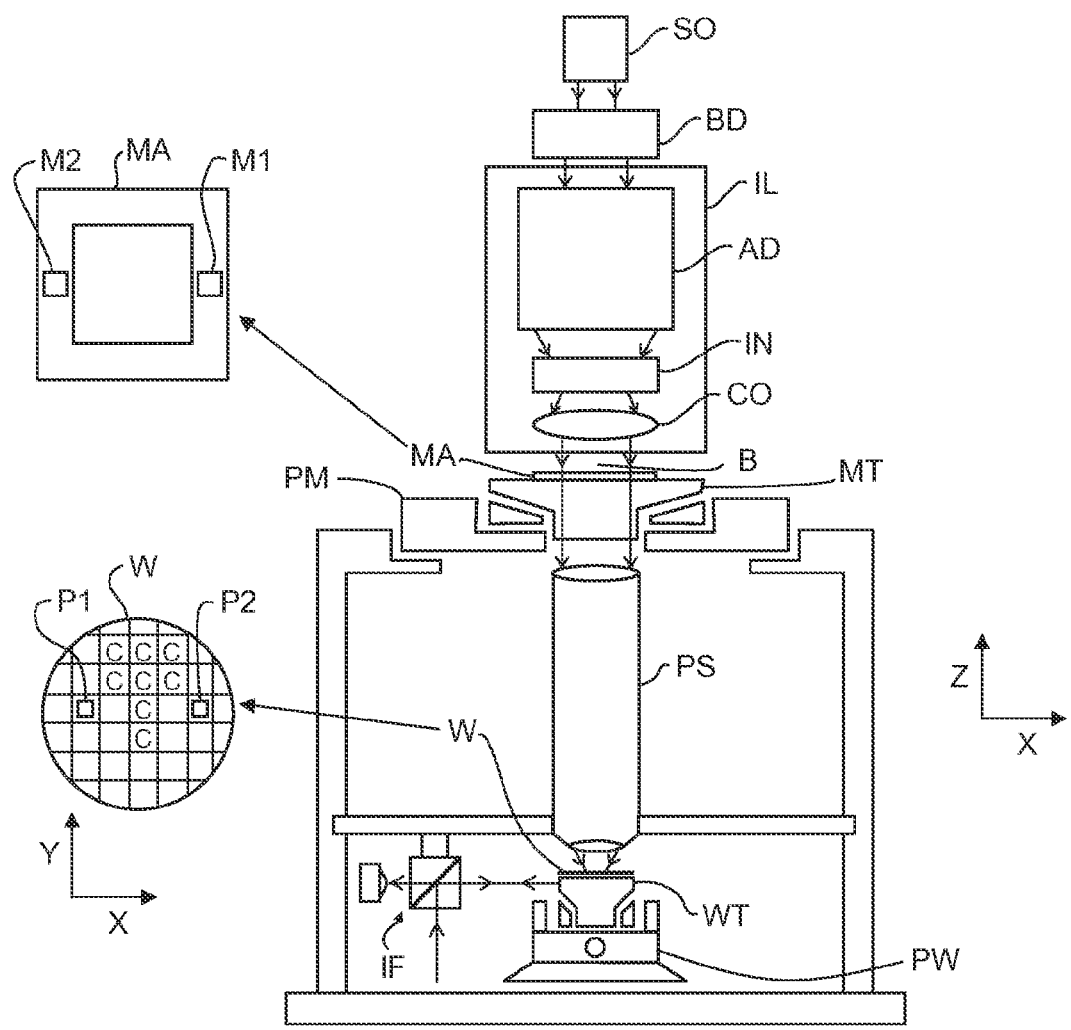
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The substrate holder of FIG. 1 may be subjected to relatively large accelerations in order to quickly move the substrate through the lithographic apparatus thereby increasing the obtainable throughput of the lithographic apparatus. Due to these accelerations, the substrate holder will deform thereby influencing the position accuracy of the substrate held by the substrate holder if no appropriate measures are taken.

In this embodiment, the substrate holder is allowed to deform. Hence, the substrate holder is not specifically designed to be as stiff and rigid as possible although the invention may also be applied to stiff and rigid substrate holders as well. As the following description is not limited to a substrate holder, but may well be applied to other members of the lithographic apparatus of FIG. 1 as well, reference may be made to a member in general or to a substrate holder specifically where the reference to a substrate holder is not to be construed as being limiting.

The deformation of the substrate holder is measured using one, preferably more deformation sensors, and based on their output actuators in or near the substrate holder are operated in order to compensate the measured deformations thereby obtaining a desired position accuracy of the substrate held by the substrate holder.

Figure 2:
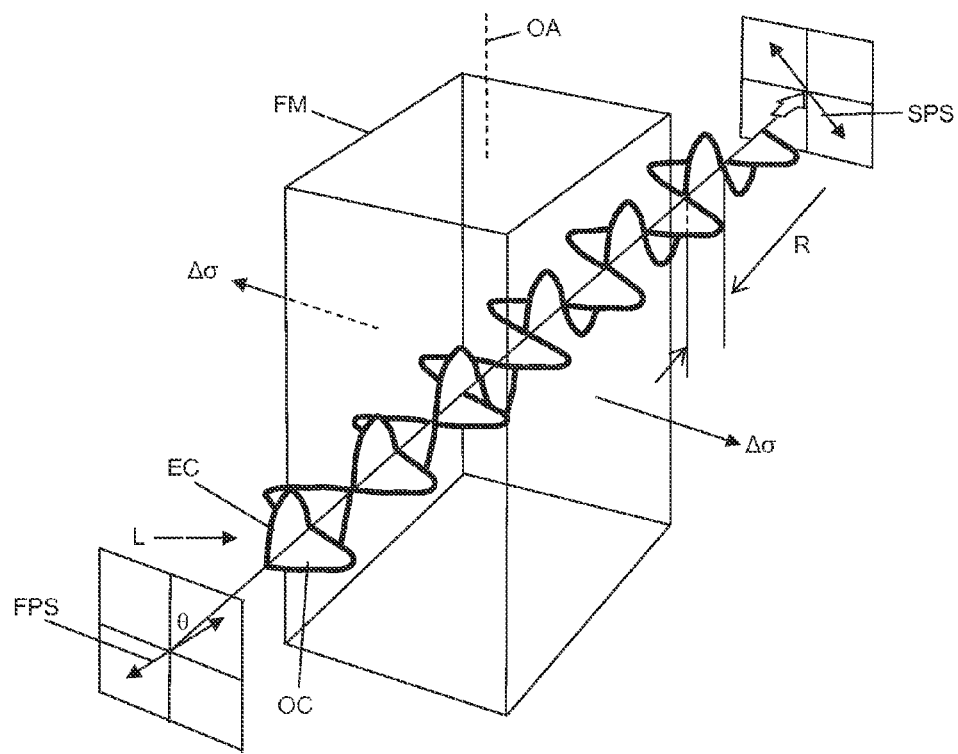
FIG. 2 depicts the working principle of a deformation sensor according to an embodiment of the invention.

FIG. 2. depicts the working principle of a deformation sensor that can be used to measure a deformation of the substrate holder. As described above, the working principle of the deformation sensor is not limited to a substrate holder, but may be applied to any deformable member of the lithographic apparatus, such as the support for holding the patterning device, lenses and mirrors, etc.

Shown in FIG. 2 is a first birefringence sensing element FM of a deformation sensor. The deformation sensor further comprises a light system (not explicitly shown) to transmit polarized light L through the first birefringence sensing element FM. The polarized light L has a first polarization state FPS prior to being transmitted through the first birefringence sensing element FM.

In a preferred embodiment, the polarized light is monochromatic, e.g., provided by a monochromatic light source, such as a laser light source, but polychromatic light sources such as LEDs may also be used in the light system to provide the polarized light.

When the first birefringence sensing element is subjected to stress in dependency of a deformation the birefringence properties of the first birefringence sensing element are changed at the location of the stress. In the example of FIG. 2, the first birefringence sensing element is isotropic in the absence of stress and no birefringence effect occurs. This means that the travelling speed of the light through the first birefringence sensing element is independent of the polarization direction. In case the first birefringence sensing element is subjected to stress $\Delta\sigma$, the first birefringence sensing element becomes anisotropic with birefringence properties as a result. When the stress occurs in a direction perpendicular to the propagation direction of the light L, the behavior of the light in the first birefringence sensing element will be different for different polarization states.

The anisotropy caused by stress $\Delta\sigma$ results in an optical axis OA perpendicular to the propagation direction of the light L and the stress direction indicated by arrows A.

The polarized light is transmitted through the first birefringence sensing element with a first polarization state FPS, which is in this case a linear polarization state having a nonzero angle $\theta$ to the optical axis OA and preferably also a nonzero angle to the stress direction $\Delta\sigma$. The angle $\theta$ is preferably around 45 degrees.

Due to the birefringence effect, the light L is resolved in two components, namely an extraordinary component EC having a polarization parallel to the optical axis, and an ordinary component OC having a polarization perpendicular to the optical axis, wherein the speed with which the components travel through the first birefringence sensing element is different for each component. This leads to a relative phase retardation R between the two components that manifests itself as a second polarization state SPS different from the first polarization state FPS. In the example of FIG. 2 a relative retardation of a half wavelength has occurred, resulting in a linear polarization again that is rotated 90 degrees with respect to the first polarization state. However, in some situations the relative retardation may be much smaller that then manifests itself as an elliptical polarization state close to linear polarization. When the polarization change is somewhat larger the polarization state may become circular.

If the relative retardation R is zero in the absence of stress, the relation between relative retardation and the stress is given by the following formula $$R = C_o \Delta\sigma \cdot d$$

where $C_o$ is the stress optical coefficient for a specific wavelength of light and d is the traveling distance of the light L in the first birefringence sensing element subjected to the stress $\Delta\sigma$.

An example of a suitable material for the first birefringence sensing material is a lithium aluminosilicate glass ceramic known under the registered trademark Zerodur. Filling in some typical values, such as a stress $\Delta\sigma$ of 9.1 N/m² corresponding to 0.1 nanostrain and a Youngs modulus of 91 GPa, a stress optical coefficient $C_o$ of $3.0 \cdot 10^{-2}$ m²/N for a wavelength of 589.3 nm of the polarized light L, and a traveling distance d of 50 mm, the relative retardation R is about 0.0014 nm.

In the above described embodiment, the situation is that no relative retardation occurs in the absence of stress, but other situations can also be used in the present invention. For instance, the material may already be anisotropic in the absence of stress, such that a relative retardation is always present, but the magnitude thereof changes due to the stress. The formula for the relation between relative retardation and stress may then become $$R = R_0 + C_o \Delta\sigma \cdot d$$

where $R_0$ is the relative retardation in the absence of stress.

Based on the first and second polarization states, and for instance one of the formulas above, a calculation unit may determine the deformation of a member, e.g., the substrate holder of a lithographic apparatus, mounted or attached to the first birefringence sensing element. In an alternative embodiment, the first birefringence sensing element is an integral part of said member and no special mounting or attaching for the deformation sensor is required.

An advantage of this measurement principle is that with a relatively simple measurement configuration, an high resolution for accurate measuring the deformation can be obtained. Initial experiments show that a resolution below 1 nanostrain can easily be achieved. A further advantage is that electronic components such as a light source and a detection element do not necessarily have to be located on the member of which the deformation is measured, such that no wires causing disturbances have to be provided to said member.

Figure 3:
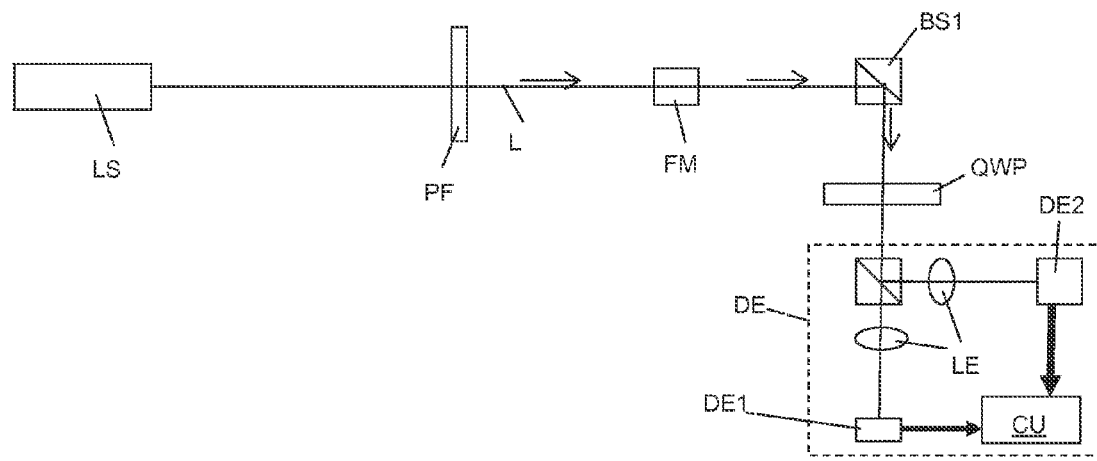
FIG. 3 depicts a schematic overview of a deformation sensor according to an embodiment of the invention.

FIG. 3 depicts a schematic overview of a deformation sensor. Shown is a light system comprising a light source LS and a polarizing filter PF for providing monochromatic linear polarized light L to be transmitted through a first birefringence sensing element FM. The light system of this embodiment is configured such that the linear polarized light has a nonzero angle, preferably a 45 degrees angle to the optical axis of the first birefringence sensing element when subjected to stress, i.e., the polarization direction has a nonzero angle to the optical axis of the first birefringence sensing element.

Providing the linear polarized light with a nonzero angle to the optical axis of the first birefringence sensing element can be done by arranging the light system and thus all optical elements in a plane having a nonzero angle to a plane spanned by the optical axis of the first birefringence sensing element and the propagation direction of the light through the first birefringence sensing element. Alternatively, before and after the first birefringence sensing element, a half wave plate may be provided to rotate the polarization to a direction with a nonzero angle to the optical axis and back, so that all optics in practice can be arranged in a plane spanned by the optical axis and the propagation direction of the light traveling through the first birefringence sensing element.

The polarization direction of this linear polarized light L incident to the first birefringence sensing element will be called p polarization or the p component and the polarization direction perpendicular to the p polarization will be called s polarization or the s component. The first polarization state of the polarized light prior to being transmitted through the first birefringence sensing element is in this example thus p polarization only.

Due to the transmittal of the light L through the first birefringence sensing element, the polarization state of the light may be changed to light having p and s polarization. This polarization state is called the second polarization state. When the stress is relatively small and/or the traveling distance in the first birefringence sensing element is relatively small, the change of polarization will also be small, so that the s component of the second polarization state is small compared to the p component of the second polarization state. The s component is the signal representative for the change in polarization.

The light system further comprises a beam splitter BS1, e.g., a partial polarizing beam splitter, giving for instance 20% reflection for p polarization and 100% reflection for s polarization, so that after the light has traveled through the beam splitter BS1, the s component is enhanced by a factor five with respect to the p component, thereby enhancing the signal component over the DC light component, i.e., the p component, and reducing shot noise.

Before the light reaches a detector DE, the light is transmitted through a quarter-wave plate QWP to change the polarization state from nearly linear to nearly circular polarization. This light is then passed through a beam splitter BS2, e.g., a polarizing beam splitter, which splits the light into a light beam having p polarization only and a light beam having s polarization only. The intensity of the light beams is detected by respective detection elements DE1, DE2. To this end, the light beams may be focused on said detection elements by appropriate lens elements LE.

In an embodiment, the light source LS may not be located on the member. Instead the light source LS may be located on a body that may be stationary, such as a base frame. In case of a moveable member, the light source may be located on a body configured to move along with the member. For example the member may be located on a short-stroke module while the light source is located on a long-stroke module carrying the short-stroke module. The same may apply to the detection elements. An advantage is that wires connected to the light source and/or the detection elements do not disturb movement of the member.

From the difference in intensity of the light beams, the stress in the first birefringence sensing element may be calculated, which stress can be used to calculate the deformation of the member to which the first birefringence sensing element is mounted or attached or of which the first birefringence sensing element is a part of The calculation is done using a calculation unit CU.

Figure 4:
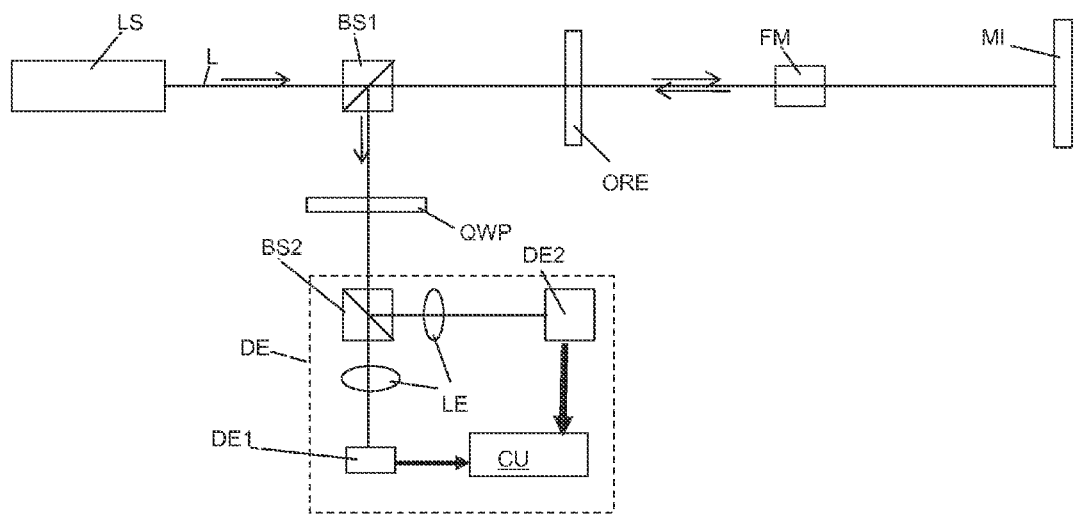
FIG. 4 depicts a schematic overview of a deformation sensor according to another embodiment of the invention.

FIG. 4 depicts an alternative schematic overview of a deformation sensor. Shown are a light system comprising a light source LS for providing polarized light L having p polarization, which p polarization is having a nonzero angle, preferably 45 degrees with the stress to be measured in a first birefringence sensing element FM. This nonzero angle is formed by an optical rotation element ORE, e.g., a half-wave plate, which is able to rotate a linear polarized light beam to the desired nonzero angle, i.e., the polarization direction of the linear polarized light beam is rotated to the desired nonzero angle. In an alternative embodiment, the optical rotation element may be omitted and the light system, i.e., the light system including all optical elements have to be rotated such that the linear polarized light from the light system has the appropriate nonzero angle and no additional rotation is required.

Before being transmitted through the first birefringence sensing element, the light L passes through a beam splitter BS1 giving for instance 80% transmission and 20% reflection for p polarization and 100% reflection for s polarization. Which means that any residual s polarization present in the light provided by the light source is filtered out by the beam splitter BS1.

The light then travels through the optical rotation element to rotate the linear polarized light beam to the desired nonzero angle to be sensitive to the stress direction to be measured.

The light then travels through the first birefringence sensing element that is subjected to stress in dependency of deformation of a member to which the sensing element is attached or of which the sensing element is part of Due to traveling through the first birefringence sensing element, the polarization state is slightly changed. The light then reflects of a mirror MI of the light system to be transmitted again through the first birefringence sensing element that changes the polarization state again slightly. After passing the first birefringence sensing element, the light is a combination of p polarized light and s polarized light. An advantage of being transmitted twice through the first birefringence sensing element is that the polarization change is twice as high and thus improves the resolution of the deformation sensor.

The light is then rotated back by the optical rotation element ORE for further processing by the deformation sensor.

The light is then directed by the beam splitter BS1 to the detector DE, and while being directed by the beam splitter, the s component of the light is enhanced by a factor five compared to the p component due to the difference in reflection.

Before the light reaches the detector DE, the light is transmitted through a quarter-wave plate QWP to change the polarization state from nearly linear to nearly circular polarization. This light is then passed through a beam splitter BS2 that splits the light into a light beam having p polarization only and a light beam having s polarization only. The intensity of the light beams is detected by respective detection elements DE1, DE2. To this end, the light beams may be focused on said detection elements by appropriate lens elements LE.

From the difference in intensity of the light beams, the stress in the first birefringence sensing element may be calculated, which stress can be used to calculate the deformation of the member to which the first birefringence sensing element is mounted or attached or of which the first birefringence sensing element is a part of The calculation is done using a calculation unit CU.

The amount of birefringence sensing elements, their location and orientation and the path the light travels through the birefringence sensing element can be chosen in different ways. An example is shown in FIG. 5.

Figure 5:
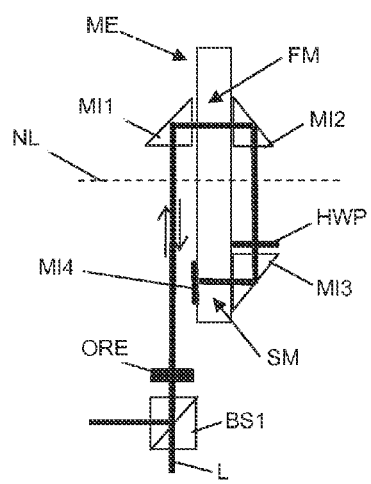
FIG. 5 depicts a configuration of a deformation sensor according to yet another embodiment of the invention.

FIG. 5 depicts a member ME of a lithographic apparatus, for instance a substrate holder constructed to hold a substrate. The member ME is susceptible to deformation. A deformation sensor may be provide to measure this deformation. The deformation to be measured by the deformation sensor of FIG. 5 is bending about a neutral axis NL, such that member ME is subjected to stresses in a direction perpendicular to the plane of drawing. For instance, the member ME may be bend such that compressive stresses occur in the upper region of the member above the neutral axis NL and tensile stresses occur in the lower region of the member below the neutral axis NL or the other way around.

Integrated into the member are a first birefringence sensing element FM and a second birefringence sensing element SM. The sensing elements are integrated into the member because the member is made of an appropriate material having the required properties. Hence, the first and second birefringence sensing elements are attached to each other and form one unit. Due to the bending of the member, the stresses in the first and second birefringence sensing elements have an opposite direction, and thus their influence on the birefringence of the sensing elements is also opposite.

A light system provides polarized light L that is transmitted through a beam splitter BS1, through an optical rotation element ORE (e.g., a half-wave plate) to rotate the linear polarized light to a direction that eventually has a nonzero angle with the optical axes in the first and second birefringence sensing element, and subsequently directed through the first birefringence sensing element FM by a first mirror MI1. Due to the stresses in the first birefringence sensing element, the polarization of the light is changed. The light then passes a second mirror MI2 and a third mirror MI3 to be transmitted through the second birefringence sensing element. If no measures were taken, the polarization change in the second birefringence sensing element would be opposite to the polarization change in the first birefringence sensing element thereby reducing the total polarization change, possibly to zero.

Therefore, a half-wave plate HWP is provided in between the first and second birefringence sensing elements, so that the polarization changes add up. The optical axis of the half-wave plate HWP is then having an orientation that is non-45 degrees to the polarization direction of the light traveling through the half-wave plate, preferably parallel or perpendicular to the polarization direction. The light is reflected by a fourth mirror MI4 such that the light travels back to the beam splitter BS1 thereby traveling through the second and first birefringence sensing elements and the half-wave plate again to double the polarization change. At the beam splitter, the light is directed to a detector to detect the polarization change due to the stresses in order to determine the deformation of the member.

An advantage of the deformation sensor as described in relation to FIG. 5 is that common mode stresses and thus homogeneous elongation of the member are not measured by the deformation sensor in case the first and second birefringence sensing elements are located at equal distances to the neutral axis. In case the half-wave plate HWP is omitted, the deformation sensor become insensitive to bending as described above, but then becomes sensitive to homogeneous elongation.

Figure 6:
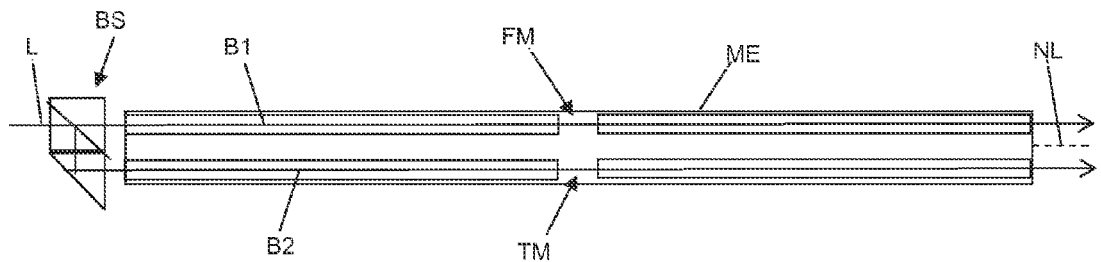
FIG. 6 depicts a configuration of two cooperating deformations sensor according to an embodiment of the invention.

FIG. 6 depicts a member ME that may be subject to bending about neutral axis NL as in FIG. 5, so that the upper and lower region are subjected to opposite directed stresses. Provided are two deformation sensors that use a common light system to provide polarized light L. The light L is split into two light beams B1, B2.

The light beam B1 is used by a first deformation sensor, which first deformation sensor comprises a first birefringence sensing element FM through which the light beam B1 is transmitted. After being transmitted through the first birefringence sensing element, the light beam B1 may be directed to a detector as shown in the embodiments of FIGS. 3 and 4.

The light beam B2 is used by a second deformation sensor, which second deformation sensor comprises a third birefringence sensing element TM through which the light beam B2 is transmitted. After being transmitted through the third birefringence sensing element, the light beam B2 may be directed to a detector as shown in the embodiments of FIGS. 3 and 4.

Due to the opposite stresses, the output of the detectors should also be opposite. This can be used to enhance the signal, e.g., by subtracting the outputs of the detectors in a calculation unit. An advantage of this configuration is that it is also possible to eliminate a common mode stress component present in both the first and third birefringence sensing elements.

Figure 7:
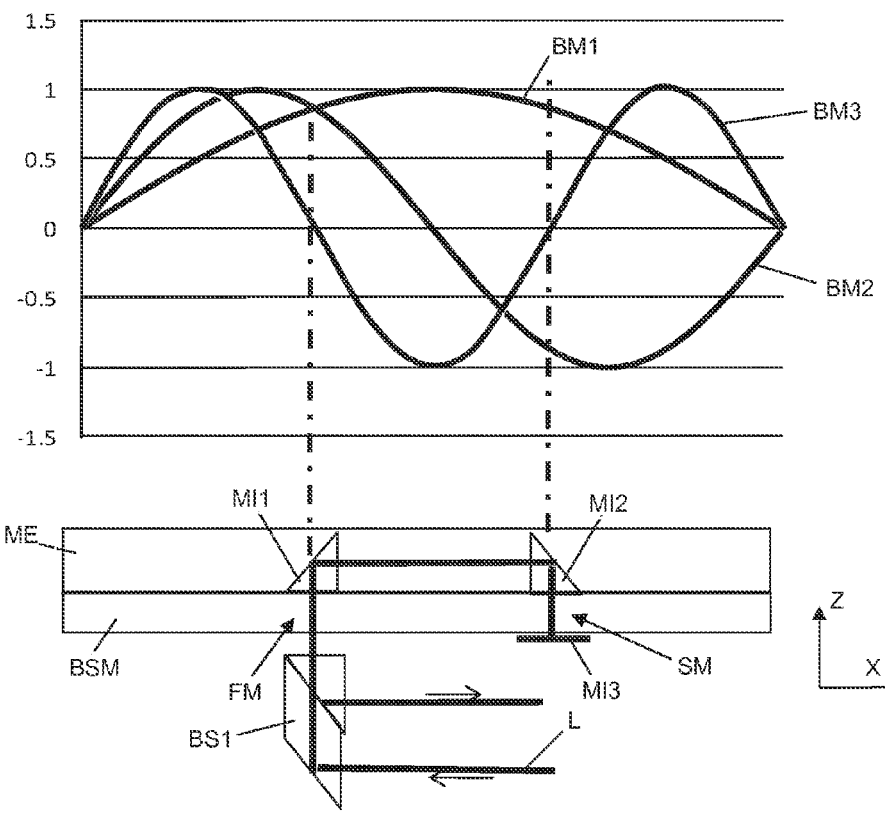
FIG. 7 depicts a configuration of a deformation sensor according to a further embodiment of the invention.

FIG. 7 depicts a member ME that is susceptible to deformation, and a deformation sensor to measure a deformation of the member ME. In this embodiment, member ME comprises a material that is at least partially transparent to the light used by the deformation sensor, and which has no birefringence properties varying with the stresses in the member ME. The member ME extends in X direction, but also in an Y direction perpendicular to the X direction and an Z direction. As a result thereof, the member ME may bend about an axis parallel to the Y direction and an axis parallel to the X direction.

Three possible bending modes are shown in the diagram above member ME, wherein BM1, BM2 and BM3 respectively denote the first, second and third bending mode. The diagram is representative for the shape of the member ME, but also for the strain and stress inside the member ME.

The deformation sensor is of a similar configuration as FIG. 5 and comprises a birefringence sensing member BSM glued or clamped to the member ME such that bending of the member ME results in stresses in the birefringence sensing member representative for said bending, wherein the stresses in the birefringence sensing member cause the birefringence of the birefringence sensing member to change.

The birefringence member BSM extends in X direction over a relatively large length, in this embodiment the dimension of the birefringence member in X direction is equal to the dimension of the said member in X direction, which has the advantage that the measurement location can be chosen freely along the birefringence sensing member BSM. It will be apparent to the person skilled in the art that equal dimensions are not necessary and that smaller dimensions may have similar advantages.

The deformation sensor further comprises a light system (only partially shown) and a detector (not shown), such that polarized light L, preferably monochromatic light, is transmitted through the birefringence sensing member BSM at two separate locations, which locations thus act as a first birefringence sensing element FM and a second birefringence sensing element SM.

The light system comprises a partial polarizing beam splitter BS1 and three mirrors MI1, MI2, MI3, to transmit the light twice through the first and second birefringence sensing elements.

The locations of the first and second birefringence sensing locations FM, SM are chosen such that the deformation sensor is not sensitive to higher order modes or their contribution to the measurement signal is limited. In the embodiment of FIG. 7 this is done by locating the first and second birefringence sensing elements at the nodes of the third bending mode BM3. As a result, the stresses of the second bending mode BM2 cancel each other, so that the deformation sensor is insensitive to this bending mode. This also applies to higher even modes. The third bending mode and higher odd bending modes are not cancelled but their contribution is small compared to the contribution of the first bending mode.

The polarized light is transmitted through the birefringence sensing member BSM in Z direction preferably with a linear polarization direction having a nonzero angle to the X direction, preferably an angle of 45 degrees relative to the X direction. In case of the preferred angle of 45 degrees the deformation sensor is highly sensitive to stresses in the X direction and the Y direction. If the deformation sensor is to be designed to measure bending in the X direction only, the birefringence sensing member BSM preferably has a small dimension in the Y direction relative to the dimension in X direction, so that the stresses in the birefringence sensing member due to bending in the Y direction remain small.

Figure 8:
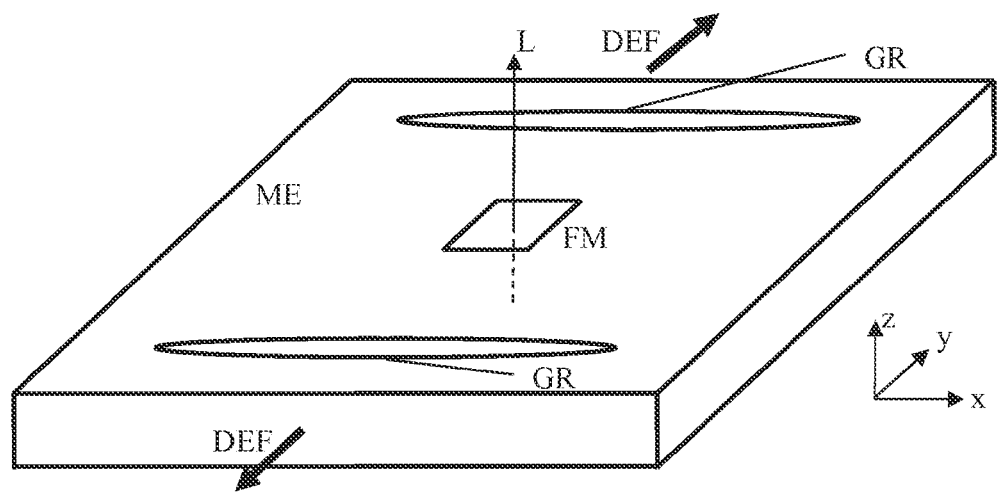
FIG. 8 depicts an isometric view of a configuration of a deformation sensor according to yet a further embodiment of the invention.

The above mentioned lithographic apparatus may be provided with a groove GR in at least one of the member ME and deformation sensor, see FIG. 8. The groove GR may be arranged to increase the sensitivity of the deformation sensor for deformations in the measurement direction. The groove GR may be arranged to decrease the sensitivity of the deformation sensor for deformations in a direction other than the measurement direction. The groove may extend parallel to the direction in which the deformation is to be measured, in this case the X-direction. The groove is relative to the first birefringence sensing element FM so as to prevent the first birefringence sensing element FM being deformed in a direction other than the measurement direction. The groove may for example partly surround the first birefringence sensing element. Stress or deformation of the member in a direction other than the direction of measurement, will be absorbed by the groove. See for example in FIG. 8, a deformation DEF in y-direction will broaden the width of the grooves GR, but will substantially not deform the first birefringence sensing element FM. This may improve the accuracy of the deformation sensor when determining a deformation in a certain direction. In FIG. 8 two grooves GR are shown. Depending on the location of the first birefringence sensing element FM, for example near an edge of the member ME, only one groove GR may be used.

In the embodiment of FIG. 8, instead of the birefringence sensing element, another type of strain sensor may be used, for example a piezo-element or a fiber-bragg grating. The strain sensor may be placed relative to the grooves GR, so as to prevent the strain sensor being deformed in another direction than the measurement direction, i.e. the direction in which a deformation is to be determined.

Figure 9:
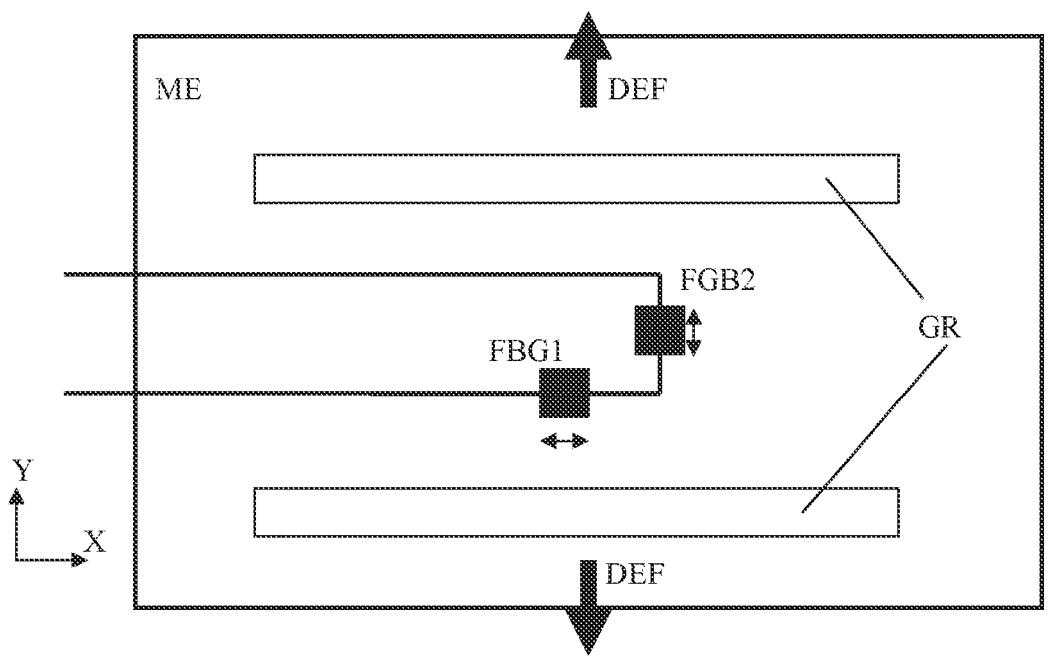
FIG. 9 depicts a configuration of a deformation sensor according to yet a further embodiment of the invention.

In an embodiment, as disclosed in FIG. 9, two grooves GR are provided in deformable member ME. The deformation sensor comprises two strain sensors, FBG1 and FBG2, for measuring strain of the member ME. Strain sensor FBG1 is sensitive to strain in the x-direction, FBG2 is sensitive to strain in the y-direction. Similar to the embodiment of FIG. 8, the grooves GR substantially prevent or reduce deformation of the strain sensors FBG1, FBG2 in the other directions than the x-direction. The exact amount of prevented or reduced deformation depends on e.g. the length of the grooves GR, the distance of the grooves GR to the strain sensors FBG1, FBG2, and the type of deformation.

The strain sensor FBG1, FBG2 may be a Fiber-bragg grating, a piezo-element or another types of strain sensors.

The strain sensors FBG1, FBG2 may be sensitive to a change in temperature. This may cause a change in the measurement signal of the strain sensors FBG1, FBG2 when the temperature changes. This may reduce the accuracy of the deformation measurement. By placing the strain sensors FBG1, FBG2 as in FIG. 9, strain sensor FBG2 does not measure any substantially deformation, because the strain sensors FBG2 is not sensitive in the x-direction and the grooves GR prevent deformation of strain sensors FBG2 in any other direction. Changes in the measurement signal of strain sensor FBG2 is therefore caused by a change in temperature. Changes in the measurement signal of the strain sensor FBG1 is caused by both deformation in x-direction and changes in temperature. Knowing the measurement signals for both strain sensors FBG1, FBG2 allows the calculation of both temperature and deformation.

The strain sensors FBG1, FBG2 may be placed as close as possible to each other element. They may be close enough to have the same temperature. The grooves GR in the embodiments of FIGS. 8 and 9 may be through holes or may be blind holes.

Although only one example of a detector DE has been shown in the figures, other detection schemes are also possible. Further, the invention is not limited to homodyne detection, but also heterodyne detection of the polarization state may be employed.

Although the given examples use linear polarized light, it will be apparent to the skilled person that the invention can also be used with any predetermined polarization state as long as the polarization change can be measured. Hence, the invention can also be used by starting with circular polarization or elliptical polarization instead of linear polarization.

Although in the examples use is made of specific optical components, optical components capable of performing the same function as described in the examples may replace the described optical components. For instance, the polarizing beam splitter used to split light in the detector and direct the different light beams to the respective detection elements may be replaced by a Wollaston prism.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a member susceptible to deformation; and
a deformation sensor comprising:

a birefringence sensing element subjected to stress dependent on the deformation of said member;
a light system, arranged to transmit polarized light having an initial polarization state through the birefringence sensing element;
a detector, arranged to detect an altered polarization state of the polarized light after being transmitted through the birefringence sensing element; and
a calculation unit to determine the deformation of said member based on the initial and the altered polarization states.

2. The lithographic apparatus of claim 1, wherein the birefringence sensing element is an integral part of the member.

3. The lithographic apparatus of claim 1, wherein the birefringence sensing element is mounted to the member using at least one of an adhesive and a clamp.

4. The lithographic apparatus of claim 1, wherein the light system comprises at least one mirror to transmit the polarized light multiple times through the birefringence sensing element.

5. The lithographic apparatus of claim 1, wherein the initial polarization state is linearly polarized and has a nonzero angle or a 45 degrees angle to a stress direction induced by the deformation to be measured.

6. The lithographic apparatus of claim 1, wherein the detector comprises a polarizing beam splitter to split the polarized light after being transmitted through the birefringence sensing element into two light beams having orthogonal polarizations relative to each other, and wherein the detector further comprises two detection elements, each detection element configured to measure the intensity of one of said two light beams.

7. The lithographic apparatus of claim 1, wherein the light system comprises a non-polarizing beam splitter or partial polarizing beam splitter to direct polarized light towards the birefringence sensing element and to ciirect polarized light after being transmitted through the birefringence sensing element to the detector.

8. The lithographic apparatus of claim 1, further comprising a groove in at least one of the member and the deformation sensor, the groove being arranged to decrease the sensitivity of the deformation sensor for deformations in a direction other than a measurement direction of the deformation sensor.

9. The lithographic apparatus of claim 8, wherein the groove is extending parallel to the measurement direction, wherein the groove is relative to the birefringence sensing element so as to prevent the birefringence sensing element being deformed in a direction other than the measurement direction.

10. The lithographic apparatus of claim 8, wherein the deformation sensor comprises an additional strain measuring sensor.

11. The lithographic apparatus of claim 1, wherein the member of the lithographic apparatus is a support constructed to support a patterning device or a substrate table constructed to hold a substrate.

12. A lithographic apparatus, comprising:
a member susceptible to deformation;
a first deformation sensor comprising:
    a first birefringence sensing element subjected to stress dependent on the deformation of said member;
    a light system, arranged to transmit polarized light having a first initial polarization state through the first birefringence sensing element; and
    a detector arranged to detect a first altered polarization state of the polarized light after being transmitted through the first birefringence sensing element;
a second deformation sensor comprising:
    a second birefringence sensing clement subjected to stress dependent on the deformation of said member, wherein a first measured stress direction of the first birefringence sensing element is opposite to a second measured stress direction in the second birefringence sensing element,
    a second light system, arranged to transmit polarized light having a second initial polarization state through the second birefringence sensing element, wherein the second initial polarization state is substantially the same as the first initial polarization state; and
    a second detector for detecting a second altered polarization state of the polarized light after being transmitted through the second birefringence sensing element; and
a calculation unit to determine the deformation of said member based on the first and the second initial and the first and second altered polarization states by subtracting the signals of the first and second detectors.

13. A lithographic apparatus comprising:
a member susceptible to deformation; and
a deformation sensor comprising:
    a first birefringence sensing element and a second birefringence sensing element subjected to stress dependent on the deformation of said member, wherein a first measured stress direction of the first birefringence sensing element, is opposite to a second measured stress direction in the second birefringence sensing element,
    a light system comprising a half-wave plate, wherein the light system transmits polarized light having an initial polarization state through the first and second birefringence sensing elements and the half-wave plate;
    a detector, arranged to detect an altered polarization state of the polarized light after being transmitted through at least the first birefringence sensing element; and
a calculation unit to determine the deformation of said member based on the initial and the altered polarization states.

* * * * *